(12) United States Patent
Wei et al.

(10) Patent No.: US 7,576,563 B1
(45) Date of Patent: Aug. 18, 2009

(54) HIGH FAN-OUT SIGNAL ROUTING SYSTEMS AND METHODS

(75) Inventors: Qin Wei, San Jose, CA (US); Chan-Chi Jason Cheng, Fremont, CA (US); Brad Sharpe-Geisler, San Jose, CA (US); Ting Yew, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/671,948

(22) Filed: Feb. 6, 2007

(51) Int. Cl.
*H01L 25/00* (2006.01)
(52) U.S. Cl. .......................................... 326/41; 326/39
(58) Field of Classification Search ............. 326/38–47, 326/16; 713/500
See application file for complete search history.

(56) References Cited

U.S. PATENT DOCUMENTS

| | | | | |
|---|---|---|---|---|
| 4,758,745 A * | 7/1988 | Elgamal et al. | ............... | 326/16 |
| 5,457,410 A * | 10/1995 | Ting | ........................... | 326/41 |
| 5,847,579 A * | 12/1998 | Trimberger | ................. | 326/41 |
| 6,150,841 A * | 11/2000 | Agrawal et al. | ............... | 326/41 |
| 6,218,859 B1 * | 4/2001 | Pedersen | ..................... | 326/39 |
| 6,300,794 B1 * | 10/2001 | Reddy et al. | ................... | 326/41 |
| 6,636,070 B1 * | 10/2003 | Altaf | ........................... | 326/38 |
| 6,696,855 B1 * | 2/2004 | Kapusta et al. | ............... | 326/39 |
| 6,996,736 B1 * | 2/2006 | Nguyen et al. | .............. | 713/500 |
| 7,268,585 B1 * | 9/2007 | Reynolds | ..................... | 326/41 |

* cited by examiner

*Primary Examiner*—Rexford N. Barnie
*Assistant Examiner*—Crystal L Hammond
(74) *Attorney, Agent, or Firm*—Haynes and Boone, LLP

(57) ABSTRACT

Systems and methods are disclosed herein to provide high fan-out signal routing. For example, in accordance with an embodiment of the present invention, a programmable logic device includes a plurality of logic blocks; an interconnect structure adapted to route signals among the logic blocks; and a secondary routing network adapted to route signals among the logic blocks. The secondary routing network may include a plurality of horizontal splines adapted to route signals within the programmable logic device; a plurality of vertical spline taps adapted to route signals within the programmable logic device; a plurality of common interface blocks adapted to route signals between the horizontal splines and the vertical spline taps; and a plurality of horizontal secondary branches adapted to route signals from the vertical spline taps to the logic blocks.

6 Claims, 9 Drawing Sheets

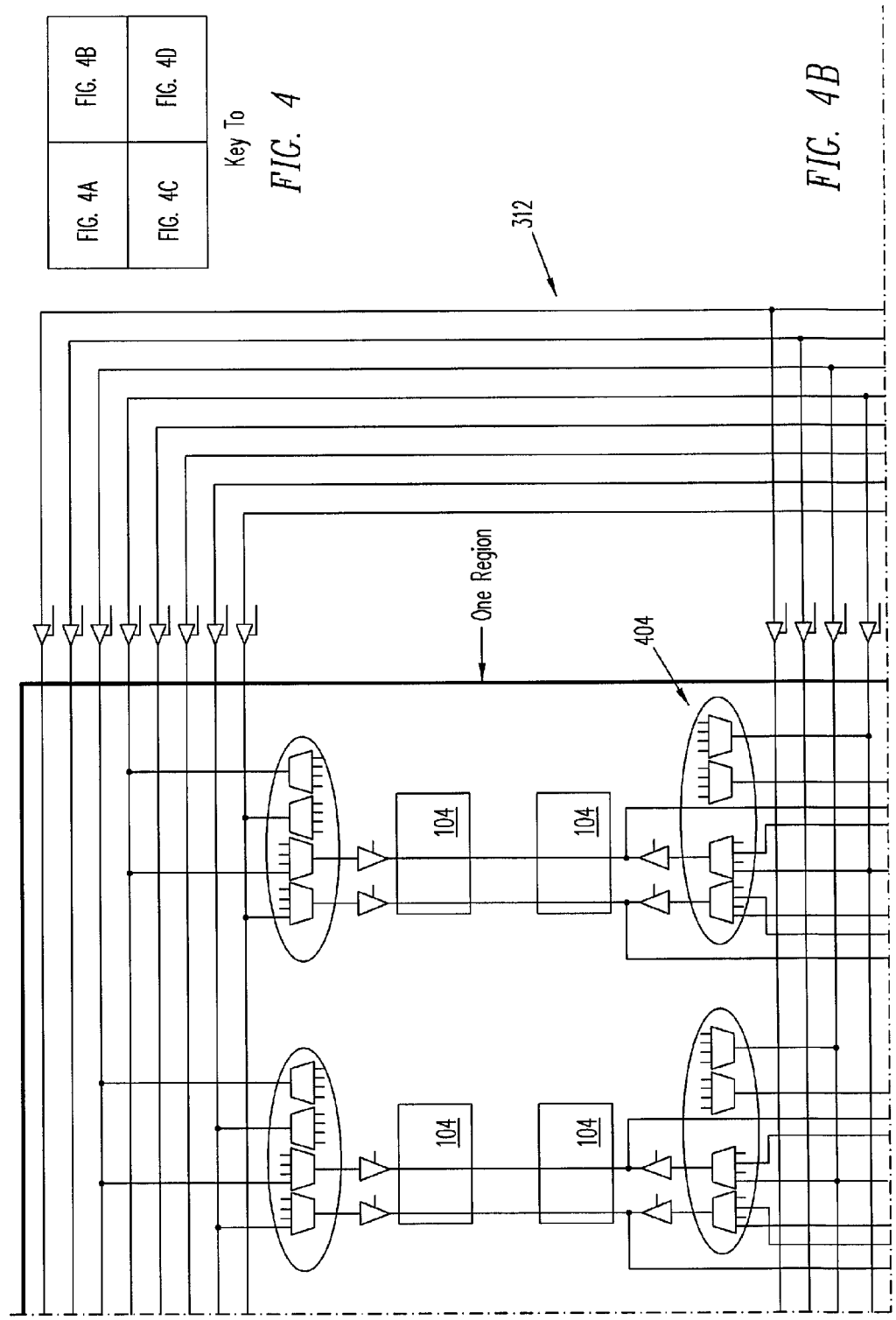

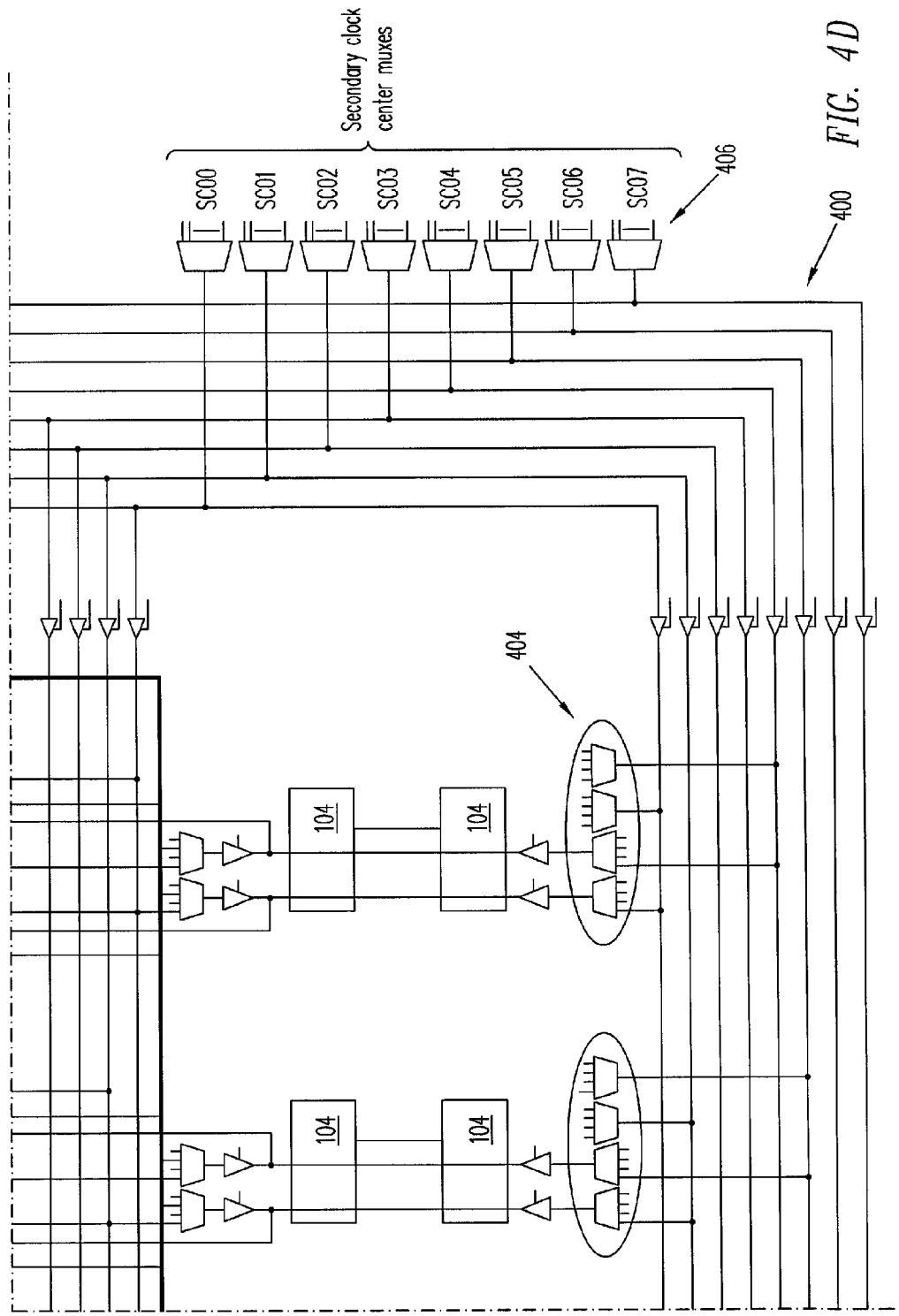

HIGH FAN-OUT SIGNAL ROUTING SYSTEMS AND METHODS

TECHNICAL FIELD

The present invention relates generally to electrical circuits and, more particularly, to routing resources, such as for example for a clock network within a programmable logic device.

BACKGROUND

A secondary clock network is often used within an integrated circuit, such as a programmable logic device (e.g., a complex programmable logic device (CPLD) or a field programmable gate array (FPGA)), to provide a routing resource for clock, control, and high fan-out data within the integrated circuit. A drawback of conventional secondary clock networks is the limited number of channels (e.g., four global channels), with a typical application often requiring to route more high fan-out signals than can be accommodated by the secondary clock network. Consequently, the additional high fan-out signals must be routed through general routing resources (e.g., a general interconnect of the PLD), which is costly in terms of routing resources utilized.

Another drawback of a conventional high fan-out network is that the network may use full or partial clock lines that require local routing resources. For example, the logic blocks of the PLD may be implemented with the local routing resources (e.g., multiplexers and drivers or buffers) to support the high fan-out signal routing of the network. However, typical PLD software for logic placement is generally not limited to a single row or column and therefore a significant amount of local routing resources within the PLD may need to be used to provide the vertical and horizontal routing. Furthermore, depending upon the clock line length and due to long line loading and distance, the buffers and other routing resources may be large, slow, cause timing skew, and may require a tri-stable bus structure to support the long clock line length.

As a result, there is a need for improved techniques for high fan-out signal routings, such as for example for a secondary clock network within a PLD.

SUMMARY

In accordance with one embodiment of the present invention, a programmable logic device includes a plurality of logic blocks; an interconnect structure adapted to route signals among the logic blocks; and a secondary routing network adapted to route signals among the logic blocks, wherein the secondary routing network comprises: a plurality of horizontal splines adapted to route signals within the programmable logic device, wherein the horizontal splines form regions having a number of rows of the logic blocks; a plurality of vertical spline taps adapted to route signals within the programmable logic device, wherein at least one of the vertical spline taps is provided for each column of the logic blocks; a plurality of common interface blocks adapted to route signals between the horizontal splines and the vertical spline taps; and a plurality of horizontal secondary branches adapted to route signals from the vertical spline taps to the logic blocks.

In accordance with another embodiment of the present invention, a programmable logic device includes a plurality of logic blocks; a general interconnect structure adapted to route signals within the programmable logic device for the logic blocks; and means for routing signals within regions of the programmable logic device, wherein each of the regions comprises a plurality of rows and columns of the logic blocks, and wherein the routing means comprises: means for routing signals along the columns of the logic blocks; and means for routing signals along the rows of the logic blocks, wherein the row routing means are driven by the column routing means.

In accordance with another embodiment of the present invention, a method of providing routing resources within a programmable logic device includes providing a plurality of logic blocks; routing signals through a general interconnect structure within the programmable logic device for the logic blocks; and routing signals through a secondary network, wherein the secondary network forms regions within the programmable logic device, with each of the regions comprised of a plurality of rows and columns of the logic blocks, and wherein the routing signals through the secondary network comprises: routing signals along the rows of the logic blocks; routing signals along the columns of the logic blocks; and routing signals between the rows and the columns of the logic blocks, wherein the row routing is driven by the column routing.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
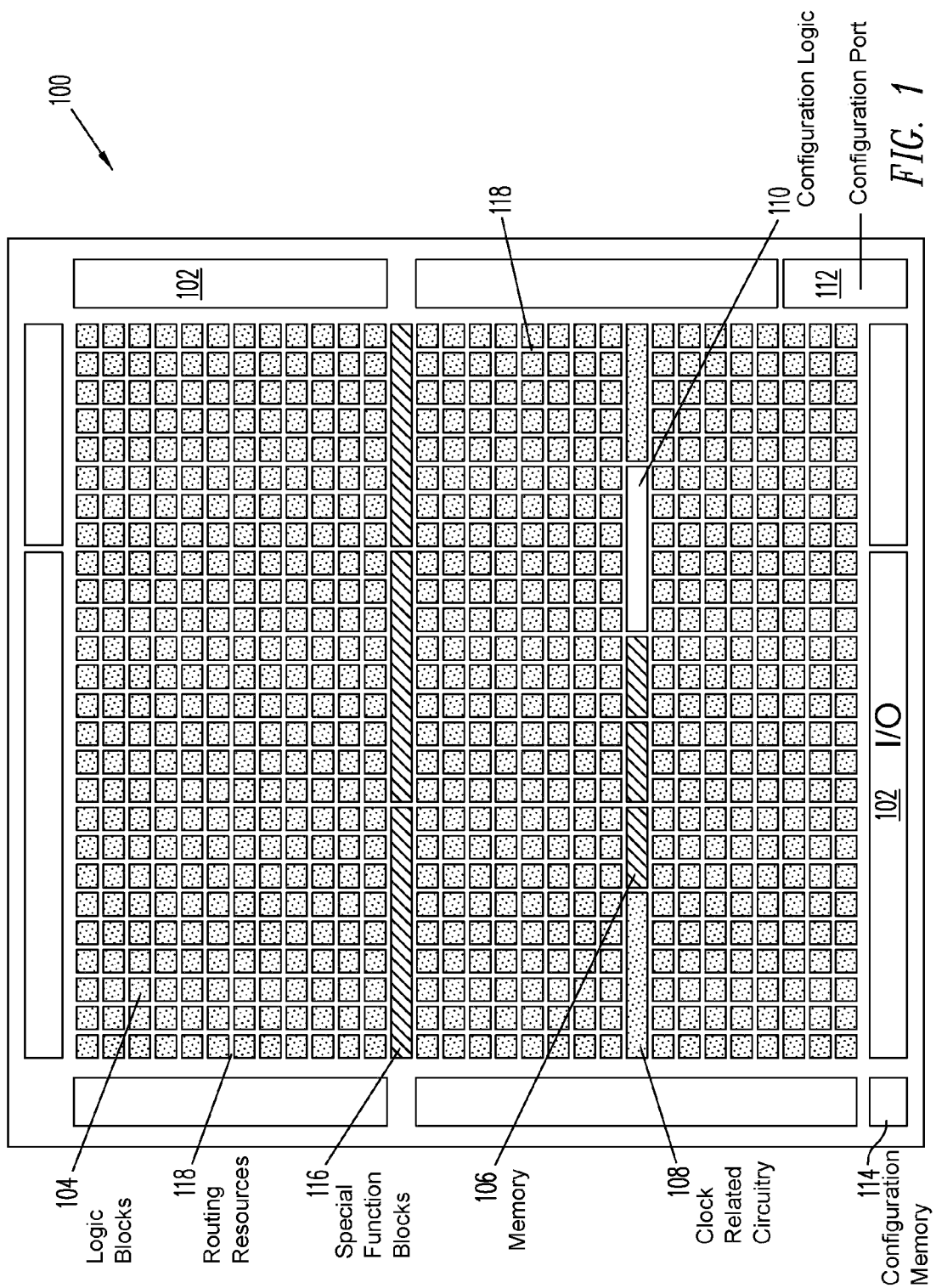
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 (e.g., an FPGA, a CPLD, or a field programmable system on a chip (FPSC)) includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., supports one or more I/O and/or memory interface standards) for PLD 100, while programmable logic blocks 104 provide logic functionality (e.g., LUT-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, encryption, and/or error detection), configuration port 112, configuration memory 114, special function blocks 116 (e.g., DSP blocks or other forms of multiply and accumulate circuit functionality), and/or routing resources 118. It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, is not limiting and may depend upon the desired application. For example, special function blocks 116 are optional as is various other elements (e.g., memory 106) and may not be required for a desired application. Furthermore, it should be understood that the elements are illustrated in block form for clarity and that certain elements, such as configuration memory 114 for example, would typically be distributed throughout PLD 100, such as in and between logic blocks 104, to perform their conventional functions (e.g., storing configuration data that configures PLD 100).

Configuration port 112 may be used for programming memory 106 and/or configuration memory 114 of PLD 100 as would be understood by one skilled in the art. For example, configuration port 112 may include a programming port, such as a central processing unit (CPU) port (also referred to as a peripheral data port or a sysCONFIG programming port) and/or a programming port such as a joint test action group (JTAG) port (e.g., by employing standards such as Institute of Electrical and Electronics Engineers (IEEE) 1149.1 or 1532 standards). Configuration port 112 typically may be included to receive configuration data and commands.

Routing resources 118, which are distributed within PLD 100, represent a conventional general interconnect routing fabric along with, in accordance with one or more embodiments of the present invention, a primary clock network and a secondary clock network. The secondary clock network, for example, may provide a region-based high fan-out signal routing with minimum overhead and without affecting significantly the general interconnect routing fabric or the primary clock network.

Figure 2:
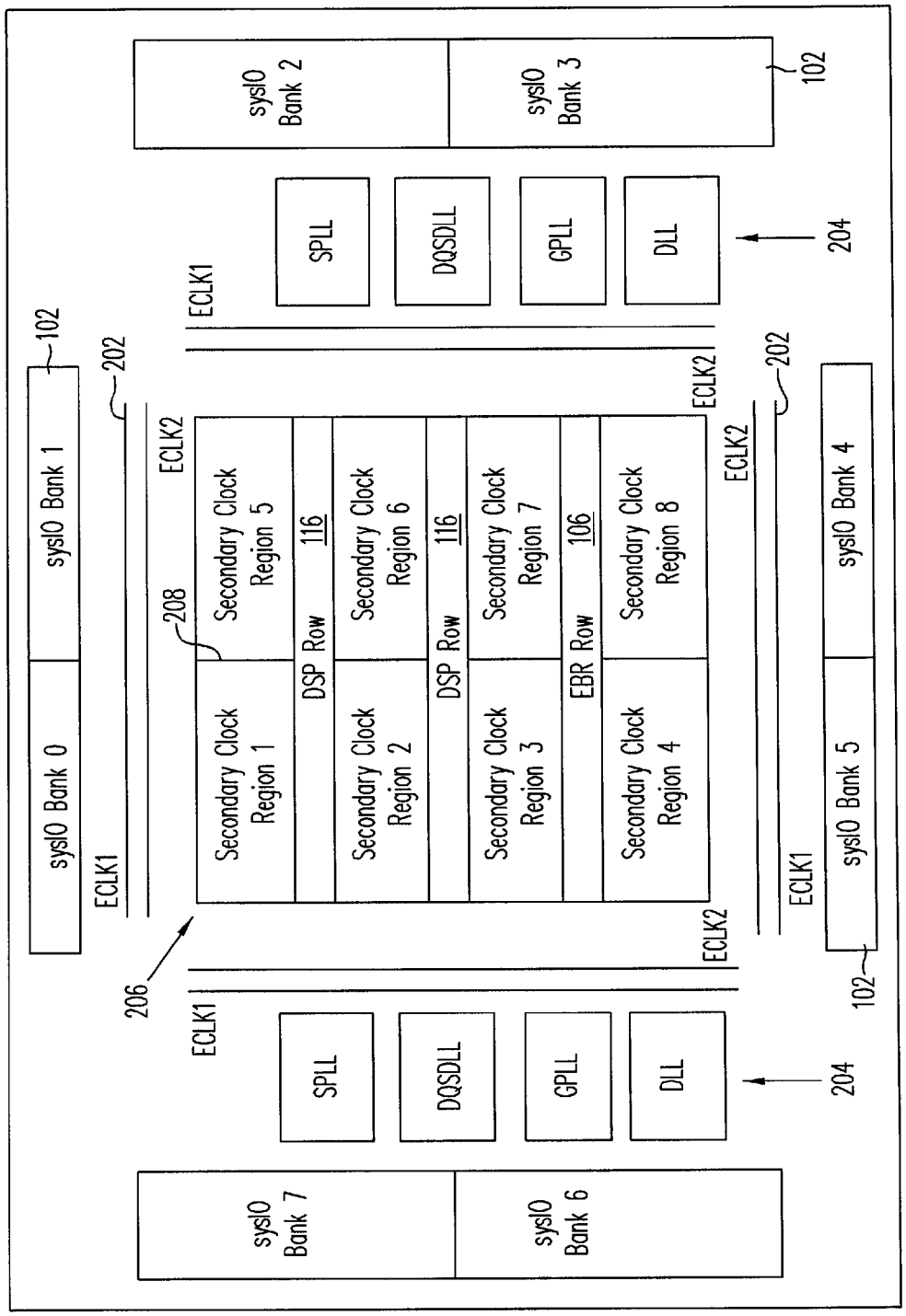
FIG. 2 shows a block diagram illustrating an example of a routing network for a programmable logic device in accordance with an embodiment of the present invention.

For example, FIG. 2 shows a block diagram of a PLD 200 illustrating an example of a routing network such as for PLD 100 of FIG. 1 in accordance with an embodiment of the present invention. Specifically, PLD 200 may represent an exemplary portion of PLD 100 to illustrate an example of a region-based secondary clock network.

PLD 200 of FIG. 2 is shown with I/O blocks 102, edge clocks 202, clock-related circuitry 204, and secondary clock regions 206. Edge clocks 202 (e.g., two edge clocks labeled ECLK1 and ECLK2) represent high performance edge clocks along one or more edges (e.g., each edge as shown) of PLD 200 to support high speed interfaces. Clock-related circuitry 204 (e.g., representing a portion of clock-related circuitry 108 of FIG. 1) may represent one or more exemplary PLLs and/or DLLs (e.g., labeled DLL, GPLL, DQSDLL, and SPLL), which provide various types of clock functionality (e.g., with and without delay adjustment). It should be understood that the number and type of clock-related circuitry 204 is not limiting and depends on the specific PLD design requirements and/or application requirements.

Secondary clock regions 206 illustrate an example of PLD 200 having a number of secondary clock regions (e.g., eight regions labeled 1 through 8). Secondary clock regions 206 may be situated among rows of special function blocks 116 and memory 106 (e.g., which provide regional boundaries) and rows of logic blocks 104 (not shown). One or more vertical routing channels 208 may be provided as part of the secondary clock network (e.g., to provide vertical regional boundaries). Thus, secondary clock regions 206 (e.g., with the number of regions being device dependent) may be bounded by edge clocks 202, vertical routing channels 208, and the rows of special function blocks 116, logic blocks 104, and memory 106.

Figure 3:
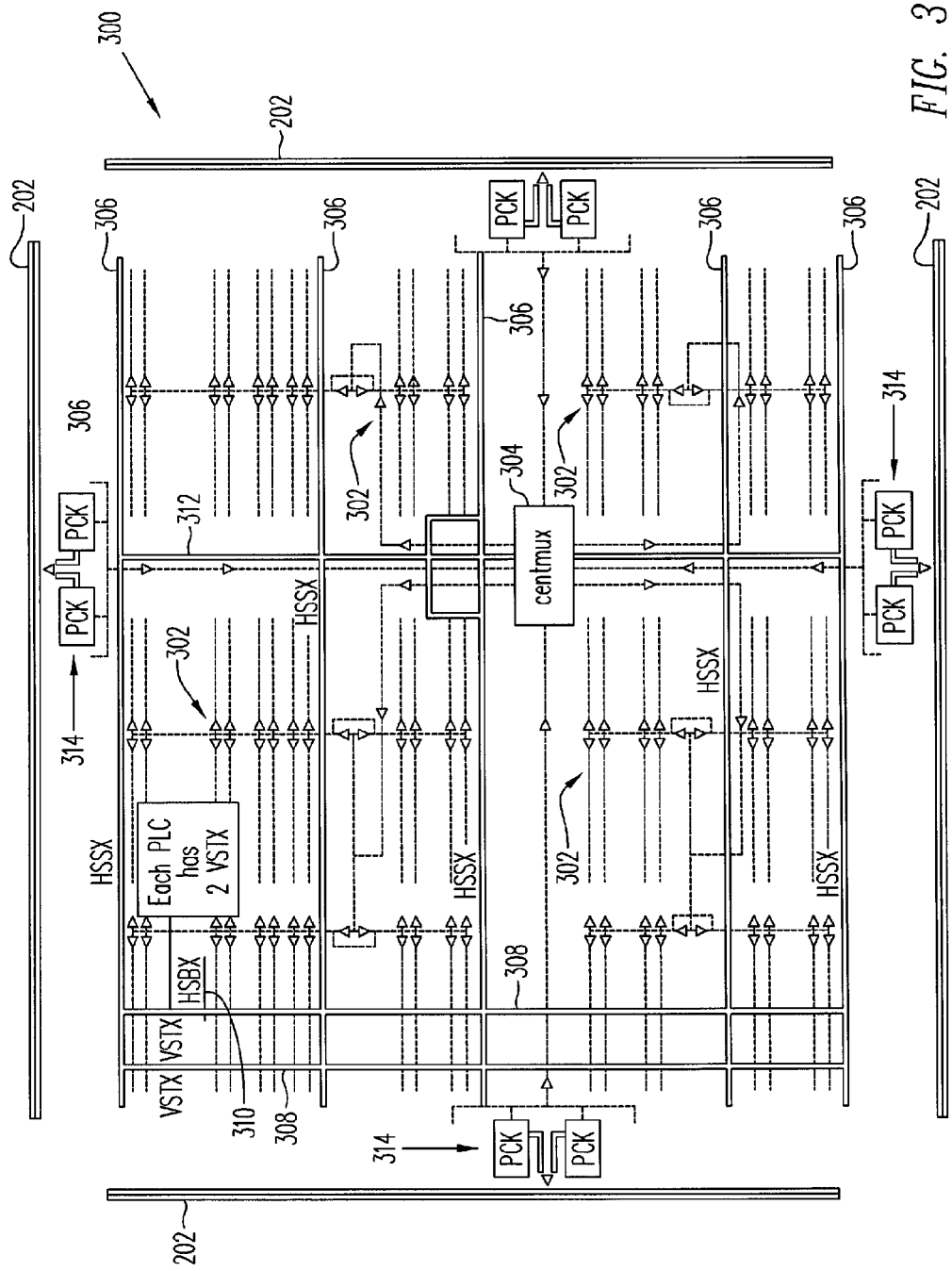
FIG. 3 shows a block diagram illustrating another example of a routing network for a programmable logic device in accordance with an embodiment of the present invention.

As a more specific example, FIG. 3 shows a block diagram of a PLD 300 illustrating an example of a routing network such as for PLD 100 of FIG. 1 in accordance with an embodiment of the present invention. Specifically, PLD 300 may represent an exemplary portion of PLD 100 to illustrate clock networks and an example of a region-based secondary clock network.

PLD 300 includes edge clocks 202, a primary clock network 302, multiplexers 304 (e.g., representing various clock distribution circuitry), horizontal splines 306, vertical spline taps 308, and horizontal secondary branches 310. One or more clock pins 314 may be provided to provide an external clock signal to edge clocks 202, primary clock network 302, and/or to the secondary clock network. Primary clock network 302 is shown generally as a clock tree (e.g., a quadrant-based clock tree) within PLD 300 and may derive clocks from various sources, such as for example from PLLs, DLLs, clock divider circuits (e.g., clock-related circuitry 108 or 204), dedicated clock inputs to PLD 300 (e.g., similar to clock pin 314), and/or from the general interconnect routing fabric.

Horizontal splines 306 (labeled HSSX), vertical spline taps 308 (labeled VSTX), and horizontal secondary branches 310 (labeled HSBX) form a spline-tap-branch structure for the region-based secondary clock network. One or more vertical splines 312 may also be provided from multiplexers 304 to provide a signal path from multiplexers 304 to horizontal splines 306 (e.g., in a cascaded and bidirectional fashion). Although only a limited number of horizontal splines 306, vertical spline taps 308, horizontal secondary branches 310, and multiplexers 304 are shown for clarity, this is not limiting and there would typically be a large number of horizontal splines 306, vertical spline taps 308, and horizontal secondary branches 310, depending upon the application and design requirements as would be understood by one skilled in the art. For example, there may be two vertical spline taps 308 for each column of logic blocks 104, with a certain number of logic blocks 104 between each row of horizontal splines 306, and four logic blocks 104 for each horizontal secondary branch 310. Horizontal splines 306 may be provided, for example, also along rows of special function blocks 116 and/or memory 106 and at various intervals of rows of logic blocks 104.

Multiplexers 304 (e.g., multiplexers and associated circuitry, such as drivers or buffers, located for example centrally and labeled centmux for this example within PLD 300) provide a selectable routing of signals onto the secondary clock network and may also function as a central switch box for primary clock network 302. In general, the secondary clock network may derive clocks or other signals from various sources, such as for example from multiplexers 304, PLLs, DLLs, and clock divider circuits (e.g., from clock-related circuitry 108 or 204), dedicated clock inputs to PLD 300 (e.g., clock pins such as clock pins 314 via programmable I/O also referred to herein as programmable I/O cells (PIC)

within I/O blocks 102), edge clocks 202, and/or from the general interconnect routing fabric.

Figure 4A:
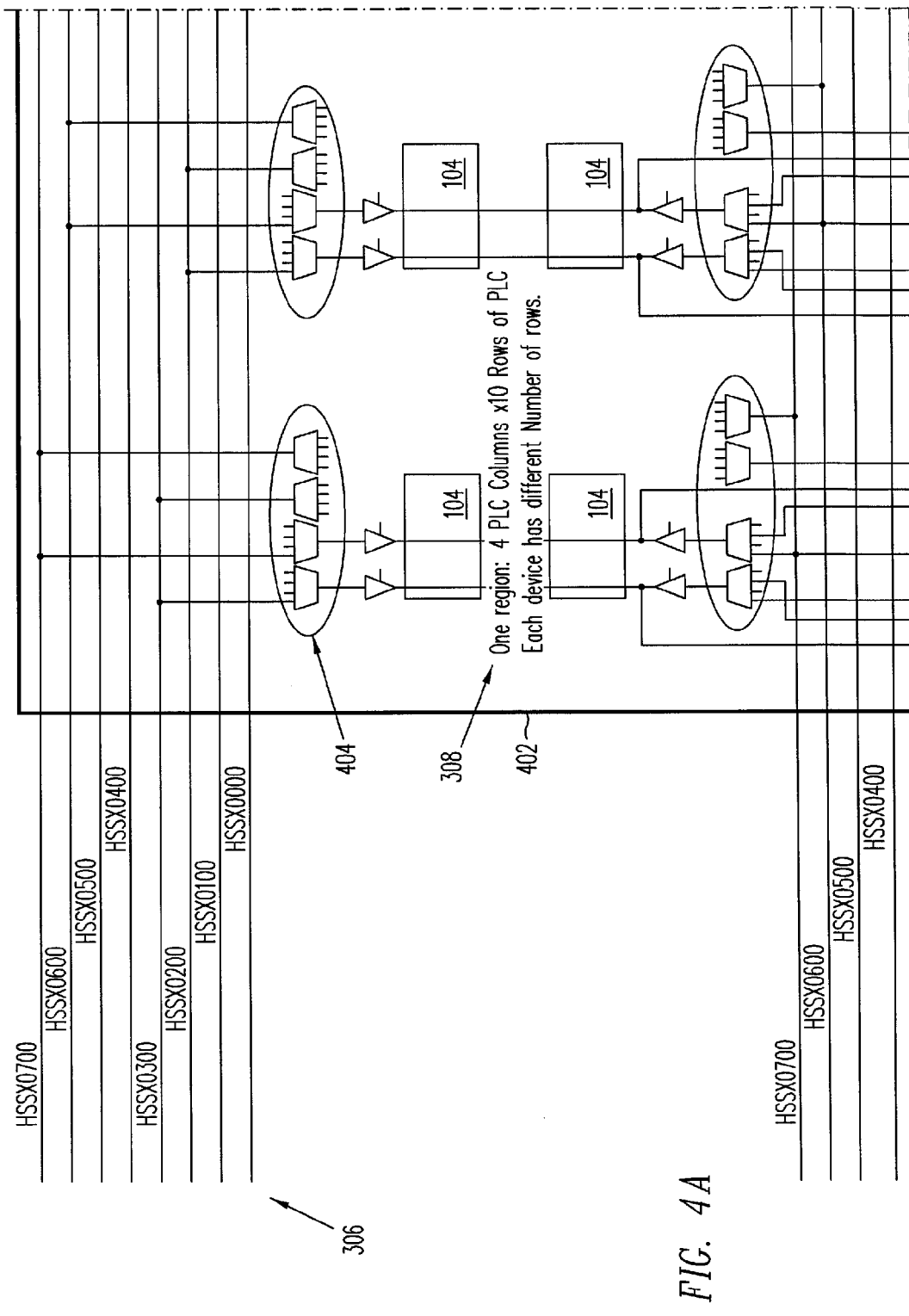
FIG. 4 shows a block diagram illustrating exemplary details for a portion of a routing network for a programmable logic device in accordance with an embodiment of the present invention.
Figure 4C:
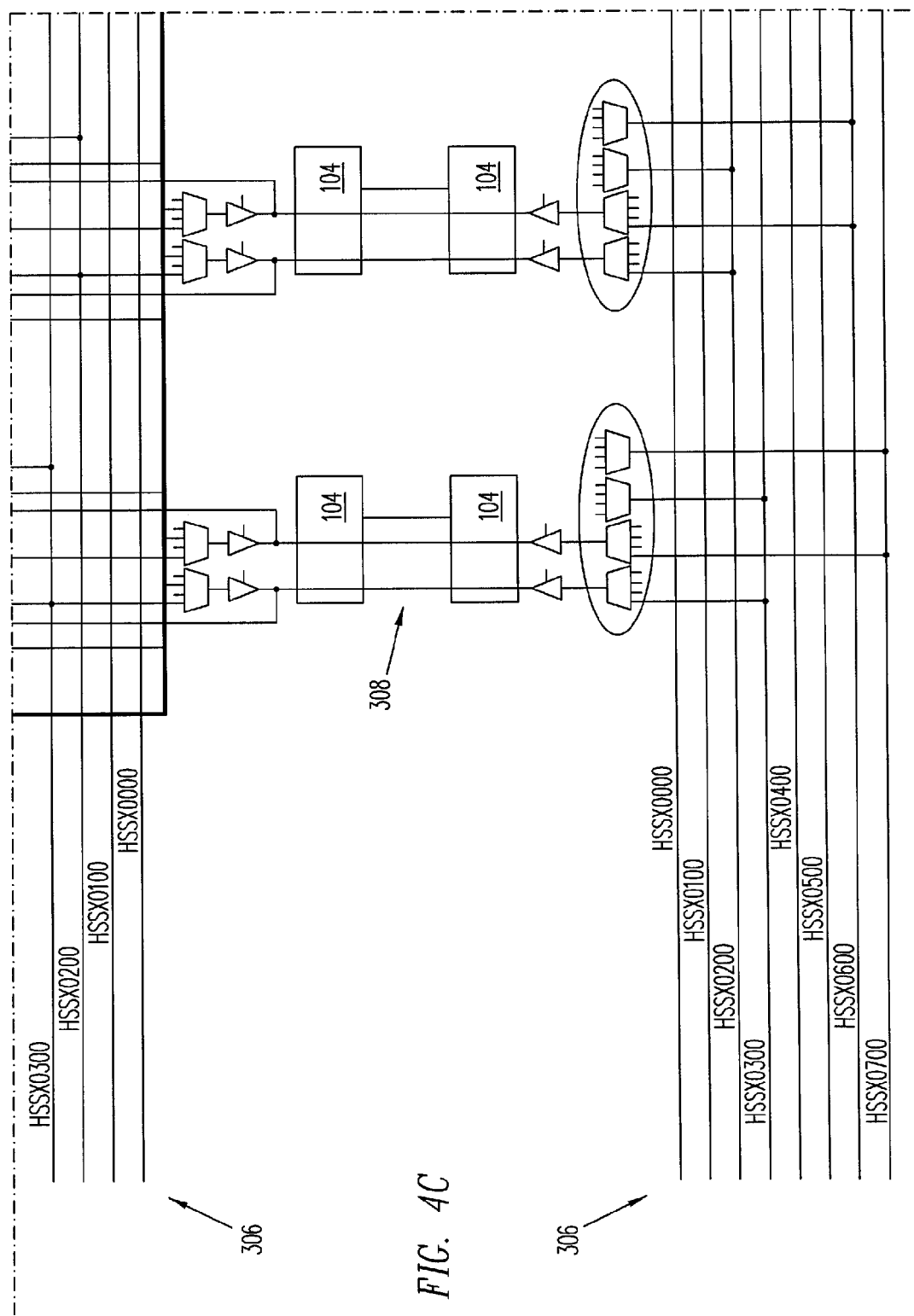
Figure 5:
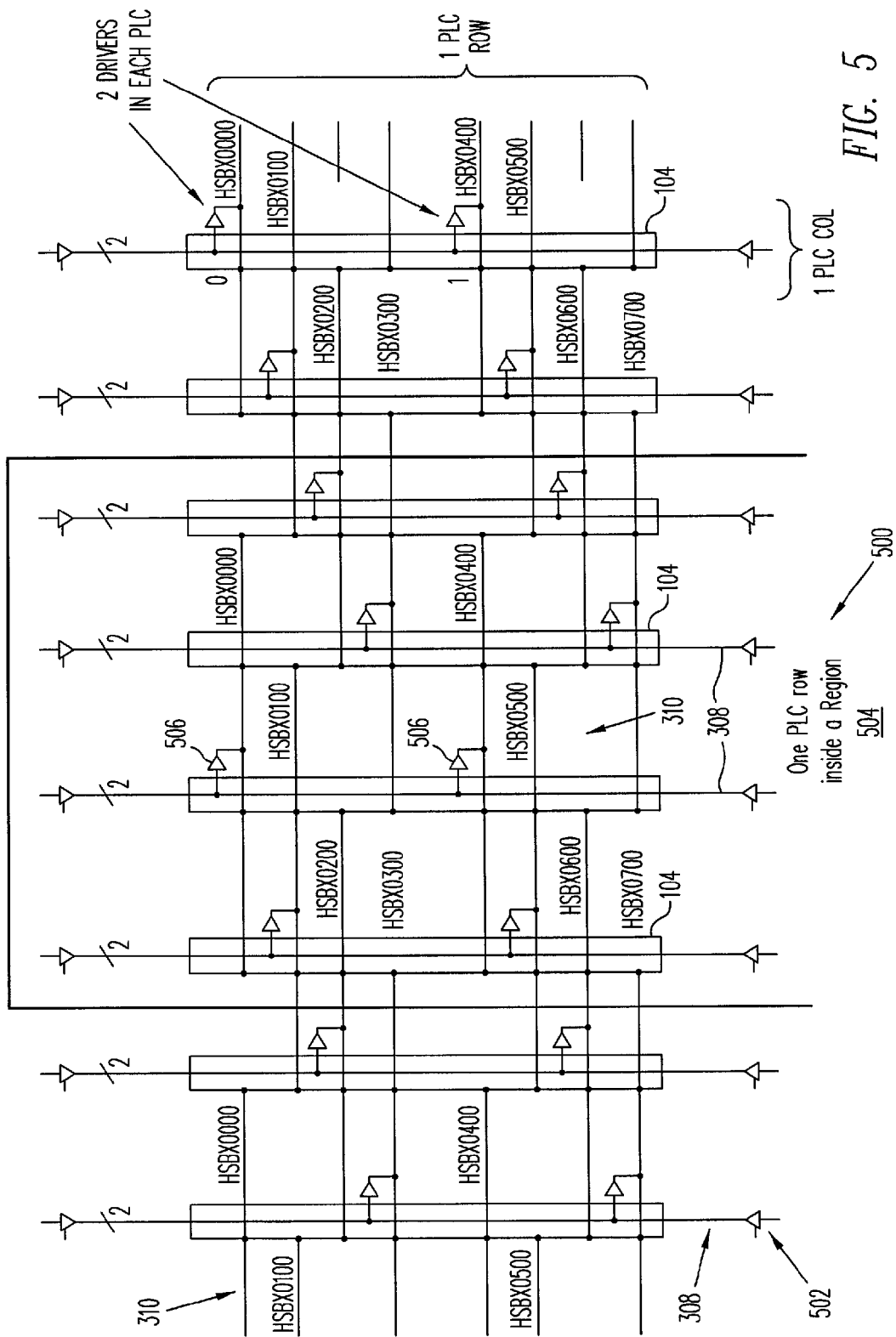
FIG. 5 shows a block diagram illustrating exemplary details for a portion of a routing network for a programmable logic device in accordance with an embodiment of the present invention.
Figure 6:
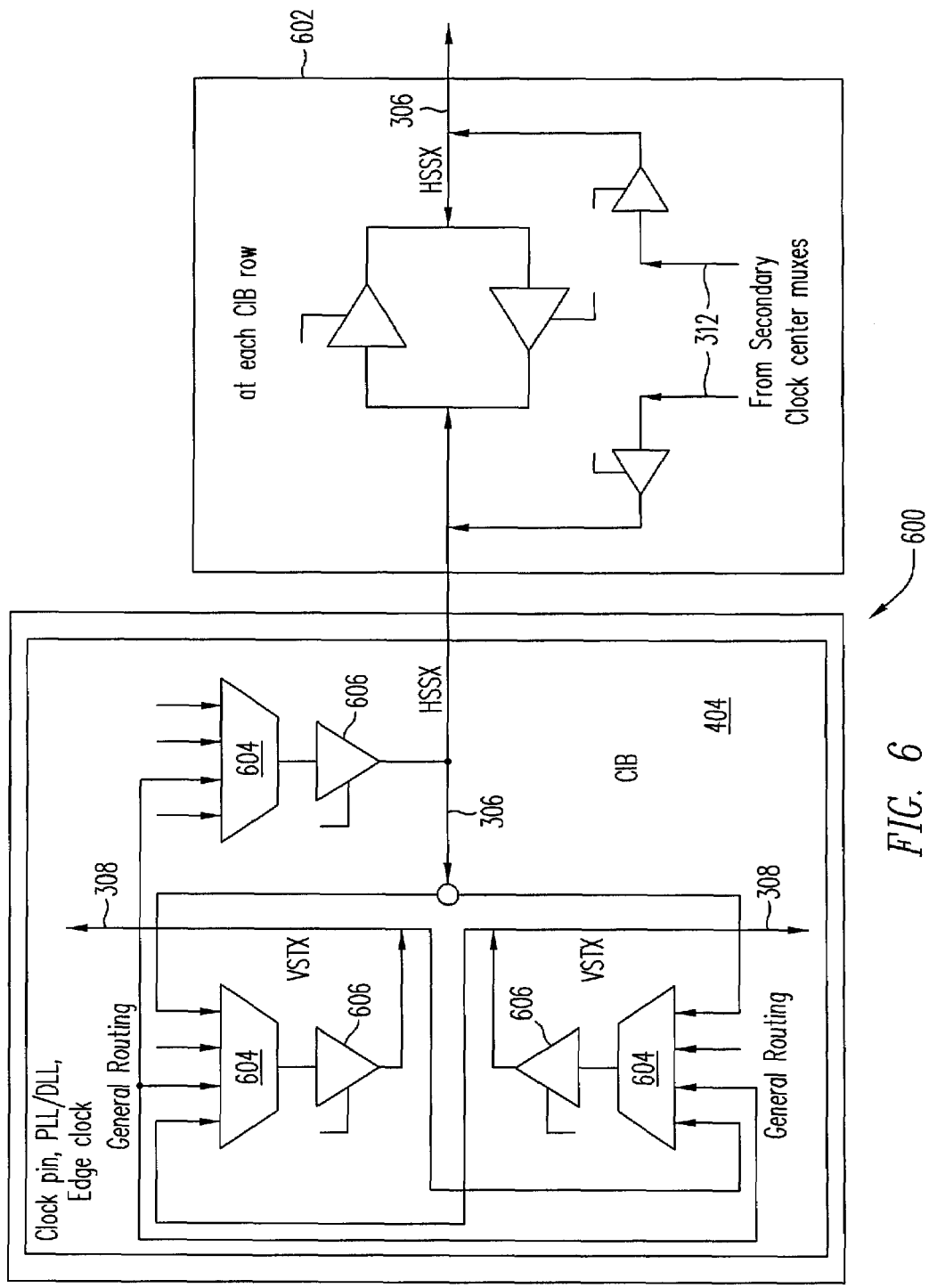
FIG. 6 shows a block diagram illustrating exemplary details for a portion of a routing network for a programmable logic device in accordance with an embodiment of the present invention.

As a specific example, FIGS. 4-6 show block diagrams of circuits 400, 500, and 600, respectively, illustrating specific exemplary implementation details for portions of the secondary routing network such as for PLD 100 of FIG. 1 in accordance with one or more embodiments of the present invention. Specifically, circuit 400 illustrates an example of one portion of the secondary clock network and certain aspects with respect to a region 402 along with horizontal splines 306 and vertical spline taps 308; circuit 500 illustrates an example of one portion of the secondary clock network and certain aspects with respect to vertical spline taps 308 and horizontal secondary branches 310; and circuit 600 illustrates an example of one portion of the secondary clock network and certain aspects with respect to interfaces and routing.

Circuit 400 illustrates a secondary clock network that includes common interface blocks (CIBs) 404 and secondary clock center multiplexers 406 along with logic blocks 104, horizontal splines 306, and vertical spline taps 308. For example, exemplary region 402 is illustrated having for example four columns and ten rows of logic blocks 104 (e.g., between rows of CIBs 404 adjacent to horizontal splines 306). It should be understood that a number of regions 402 may be implemented within PLD 100.

CIBs 404 (e.g., multiplexers and drivers within circled regions) are associated with horizontal splines 306 and route signals from horizontal splines 306 to vertical spline taps 308. For example, CIBs 404 may be associated with horizontal splines 306, with CIBs 404 supporting various rows of special function blocks 116, PICs, logic blocks 104, and/or memory 106. Multiplexers 406, which may represent a portion of multiplexers 304 (centmux of FIG. 3), are used to select the desired signals to provide to horizontal splines 306 via vertical spline 312.

Circuit 500 illustrates exemplary interconnections between vertical spline taps 308 and horizontal secondary branches 310. A region 504 includes one exemplary row and four columns of logic blocks 104 within region 402 (FIG. 4). Drivers 502 (e.g., tri-state drivers) within CIBs 404 drive signals along vertical spline taps 308 (e.g., two per logic block 104 column) and along horizontal secondary branches 310 via drivers 506. As an example, logic block 104 may include two drivers 506 (e.g., associated with two of eight horizontal secondary branches 310 within a row of logic blocks 104 within region 402), with one driver 506 for each vertical spline tap 308 (e.g., two per column of logic blocks 104) and each horizontal secondary branch 310 (e.g., not braided) spanning four logic blocks 104. As an example of an optional power saving feature, drivers 506 may be selectively switched off if not being used for a specific application.

Circuit 600 illustrates a portion of one CIB 404 (e.g., with multiplexers 604 and drivers 606) and exemplary interconnections from horizontal splines 306 to vertical spline taps 308. Circuit 600 also illustrates a circuit 602 that provides signals from secondary clock center multiplexers (e.g., multiplexers 406 of FIG. 4 via vertical splines 312) to horizontal splines 306 and CIBs 404. Circuit 602 may be located within multiplexers 304 (center multiplexers) and at each row of CIB 404 (e.g., along vertical spline 312 as illustrated in FIG. 4).

As shown, multiplexers 604 may receive signals from a clock pin, an edge clock (e.g., edge clock 202), clock-related circuitry (e.g., a PLL or a DLL), from the general routing interconnect, or from the secondary clock center multiplexers via circuit 602. Vertical spline taps 308 may also be cascaded via CIBs 404, while signals on horizontal splines 306 may be routed through circuit 602 to provide complete signal fan-out horizontally and vertically within the PLD for all regions.

As a specific example as shown in FIGS. 4-6, there are eight horizontal splines 306 running horizontally in each CIB 404 row to route signals to multiple regions with minimum timing skew. Horizontal splines 306 may be driven from local routing, multiplexers 304 (the center multiplexers), a clock pin, PLL/DLL clock circuitry, or an edge clock (e.g., unlimited sources to drive signals to a desired region). In each CIB 404, there are at least two multiplexers 604 and two spline drivers 606 and thus, four CIBs 404 will have eight drivers 606 to cover all eight horizontal splines 306.

Each horizontal spline 306 drives vertical spline taps 308 in the regions above and below the horizontal spline 306 via CIBs 404. Vertical spline taps 308 in adjoining regions may be cascaded together (e.g., up or down) and may also be driven by local routing, multiplexers 304 (the center multiplexers), a clock pin, PLL/DLL clock circuitry, or an edge clock. There are two vertical spline taps 308 for each logic block 104/CIB 404 column and the two vertical spline taps 308 span vertically through all the logic block 104 rows between two CIBs 404. Two vertical spline taps 308 drive two horizontal secondary branches 310 in each logic block 104 or CIB 404. Each horizontal secondary branch 310 only spans four logic blocks 104 or CIBs 404 and drives, for example, clock/control and input multiplexers in the destination logic block 104 or CIB 404. Four pairs of horizontal secondary branches 310 may be staggered one after another, as illustrated in FIG. 5.

As an example in reference to FIGS. 1-6, the techniques disclosed herein may be applied to provide a flexible high fan-out signal routing network, such as for a versatile, secondary clock tree network. In accordance with an embodiment of the present invention and as a specific exemplary embodiment, a PLD may include a 64 by 64 array of logic blocks, identified by its location from (0,0) to (63,63), and having a clock tree network using one or more of the techniques disclosed herein to reach all of the logic blocks (e.g., while minimizing clock skew).

For example, the clock tree network may originate from a center location, identified as A: (31,31) in the array, and branch in four directions with equal length to the center of each region (e.g., quadrant) identified as B1:(15,15), B2:(15, 47), B3:(47,15), and B4:(47,47). The center of each region may also be the branching point for each quadrant. At the center of each quadrant, the clock tree network may again branch in four directions to one quarter of the quadrant.

As an example for the first quadrant (e.g., B1), with each quarter identified as C1:(7,7), C2:(7,23), C3:(23,7), and C4: (23,23), the clock tree network from C1 will reach all 256 of the logic blocks from (0,0) to (15,15). Within this quarter of 16 by 16 logic blocks centered at C1, the clock tree network may be further extended to additional levels, such as two more levels (e.g., levels D and E) of four-way branches. The level E may be identified for example as nodes E1(1,1), E2(1, 5), E3(5,1), E4(5,5), . . . , to E16(13,13). Each of the E level nodes may have a network (e.g., subnet) that reaches the 4 by 4 logic blocks centered around each of the E nodes.

For this specific example and as disclosed herein, one or more multiplexers may be located at each of the branching points, with an input to one or more of the multiplexers being the general routing resources associated with each logic block and the clock tree from the parent network (e.g., one or more levels above in the clock tree network). Thus, the clock tree network may provide a flexible structure such that each subnet of the clock tree network may be driven by clock signals and other signals with the PLD besides clock signals, with these selected signals able to reach all of the logic blocks within its subnet. For example, a signal inserted at any point within the E level may reach all 16 logic blocks in the E node subnet, and similarly a signal inserted at the C level may reach all 265 logic blocks.

Furthermore for this example, the signal insertion to the clock tree network may be implemented as multiplexers and tri-stated drivers in both directions (e.g., the link from level D to level E may be configured from level E to level D and also from level D to level E). Therefore, any signal entering the clock tree network may be routed to not only all of the logic blocks in the subnet, but also may be routed to its parent net to reach additional subsets (e.g., as illustrated in FIG. 6).

Systems and methods are disclosed herein to provide high fan-out signal routing. For example, in accordance with an embodiment of the present invention, a region-based secondary clock network is disclosed for a PLD to provide a flexible high fan-out signal routing resource. The secondary clock network may provide certain advantages over conventional techniques, such as reduced skew, reduced power consumption due to greater segmentation, and/or reduced primary clock requirements. Furthermore, the secondary clock network may provide the ability to include programmable I/O cell (PIC) and PLL/DLL signals into a local region for clocking standard interfaces (e.g., memory or SPI4) and/or provide the ability to include edge clock signals into a local region for required functions (e.g., I/O setup/hold or clock-to-out functionality).

The secondary clock network may provide certain advantages over conventional routing approaches. For example, the region-based secondary clock network may require less overhead. As an implementation example, one secondary clock network region may support a number of logic block 104 columns and rows and may be situated between two common interface blocks (CIBs). The CIBs may be located at the boundary of each secondary clock region and include the routing overhead (rather than within the logic blocks), while consuming minimal die area. The secondary clock network region may provide minimum timing skew within a region or through regions as the regional taps may be driven by the same horizontal and/or vertical splines, rather than using local routing resources that introduce timing skews between the destinations. Furthermore, the local routing resources within the logic blocks may be allocated for other functions than for secondary clock network routing, as the horizontal and vertical taps drive the secondary clock network branches directly (rather than using local routing resources).

The region-based secondary clock network may also provide greater flexibility for PLD logic placement software to route regional high fan-out data (e.g., clock, control, or other types of data). For example, the typical logic placement software may place logic within a closed grid distance, which may span several rows and several columns. Thus, the secondary clock network region is a well-tailored resource for supporting the software requirements as a high fan-out signal may be routed within the secondary clock network region (e.g., covering a number of logic block rows and columns), may be routed across secondary clock network regions, or may be routed throughout the PLD vertically and/or horizontally through CIB buffering.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
   an array of logic blocks;
   a primary clock network adapted to route primary clock signals to logic blocks throughout the device; and
   a secondary clock network adapted to route secondary clock signals to logic blocks within secondary clock regions of the device, the secondary clock network comprising:
      a vertical spline running through the logic block array and adapted to receive a secondary clock signal;
      a plurality of horizontal splines running through the logic block array and adapted to receive the secondary clock signal from the vertical spline;
      a plurality of vertical spline taps running through the logic block array and adapted to receive the secondary clock signal from a horizontal spline; and
      a horizontal secondary branch connected to a vertical spline tap and connected directly to a plurality of logic blocks in adjacent columns of the logic block array, the horizontal secondary branch adapted to route the secondary clock signal from the vertical spline tap to the directly connected logic blocks,
   wherein the logic blocks directly connected to the horizontal secondary branch form a secondary clock region with minimum timing skew within the region.

2. The programmable logic device of claim 1, wherein a secondary clock region includes logic blocks from at least four adjacent columns and ten adjacent rows of the logic block array.

3. The programmable logic device of claim 1, wherein the plurality of logic blocks forming the secondary clock region are further directly connected by column to other horizontal secondary branches that are directly connected to other vertical spline taps to form other secondary clock regions, a logic block thereby forming part of a number of overlapping secondary clock regions.

4. The programmable logic device of claim 1 including a driver coupled between the vertical spline tap and horizontal secondary branch, the driver adapted to be switched off for saving power if a secondary clock signal is not be routed to the secondary clock region.

5. The programmable logic device of claim 1 including multiplexers for coupling the vertical spline to horizontal splines and common interface blocks for coupling horizontal splines to vertical spline taps.

6. A programmable logic device comprising:
   an array of logic blocks;
   a primary clock network adapted to route primary clock signals to logic blocks throughout the device; and
   a secondary clock network adapted to route secondary clock signals to logic blocks with secondary clock regions of the device, the secondary clock network comprising:
      a vertical spline running through the logic block array and adapted to receive a secondary clock signal;
      a plurality of horizontal splines running through the logic block array and adapted to receive the secondary clock signal from the vertical spline;
      a plurality of vertical spline taps running through the logic block array and adapted to receive the secondary clock signal from a horizontal spline; and
      a plurality of horizontal secondary branches connected to a vertical spline tap, each horizontal secondary branch connected directly to a different set of at least four logic blocks in adjacent columns of the logic block array, each horizontal secondary branch adapted to route the secondary clock signal from the vertical spline tap to the directly connected set of logic blocks,
   wherein each set of logic blocks directly connected to a horizontal secondary branch forms a secondary clock region with minimum timing skew within the region.

* * * * *

UNITED STATES PATENT AND TRADEMARK OFFICE
CERTIFICATE OF CORRECTION

PATENT NO.         : 7,576,563 B1                                Page 1 of 1
APPLICATION NO.    : 11/671948
DATED              : August 18, 2009
INVENTOR(S)        : Qin Wei et al.

It is certified that error appears in the above-identified patent and that said Letters Patent is hereby corrected as shown below:

Column 8, line 31: change "not be routed" to --not to be routed--.

Signed and Sealed this
Seventeenth Day of January, 2012

David J. Kappos
*Director of the United States Patent and Trademark Office*